US005737064A

United States Patent [19]

Inoue et al.

[11] Patent Number: 5,737,064
[45] Date of Patent: Apr. 7, 1998

[54] EXPOSURE APPARATUS FOR TRANSFERRING A MASK PATTERN ONTO A SUBSTRATE

[75] Inventors: Takashi Inoue, Sakai; Hiroyuki Nagano, Katano; Yoshimichi Ishii, Neyagawa, all of Japan

[73] Assignee: Matsushita Electric Industrial Co., Ltd., Osaka-fu, Japan

[21] Appl. No.: 699,787

[22] Filed: Aug. 20, 1996

Related U.S. Application Data

[62] Division of Ser. No. 404,768, Mar. 15, 1995, Pat. No. 5,573,877.

[30] Foreign Application Priority Data

Mar. 15, 1994 [JP] Japan .......................... 6-44050
Mar. 15, 1994 [JP] Japan .......................... 6-44051

[51] Int. Cl.$^6$ ..................................... G03B 27/60
[52] U.S. Cl. ............................... 355/73; 355/53
[58] Field of Search ................... 355/53, 73, 76, 355/77; 430/30, 397

[56] References Cited

U.S. PATENT DOCUMENTS 4,475,223  10/1984  Taniguchi et al.
4,618,261  10/1986  Flanders ........................... 356/357
4,669,868   6/1987  Chapelle et al. .................. 355/53
4,708,465  11/1987  Isohata et al. .................... 355/53
4,998,134   3/1991  Ishohata et al. ................... 355/53
5,298,939   3/1994  Swanson et al. ................... 355/53
5,377,009  12/1994  Kitaoka et al. .................. 355/53 X
5,443,932   8/1995  Ohta et al. ....................... 430/22
5,573,877  11/1996  Inoue et al. ...................... 430/30

FOREIGN PATENT DOCUMENTS 59-17247  1/1984  Japan .
 2-1905   1/1990  Japan .

*Primary Examiner*—R. L. Moses
*Attorney, Agent, or Firm*—Wenderoth, Lind & Ponack

[57] ABSTRACT

An exposure method for irradiating a mask from above the mask held in proximity to a substrate positioned below the mask to transfer a mask pattern of the mask to a photosensitive layer of the substrate by exposing the photosensitive layer to a light beam, includes the steps of using a gap-measuring device to measure a gap between a portion of the mask to be locally scanned and irradiated and a portion of the substrate to be locally irradiated, comparing a value measured by the gap-measuring device with a preset value, and locally deforming the mask and/or the substrate according to a difference between the value measured by the gap-measuring device and the preset value so as to cause the gap to approach a predetermined value.

10 Claims, 16 Drawing Sheets

EXPOSURE APPARATUS FOR TRANSFERRING A MASK PATTERN ONTO A SUBSTRATE

This is a Divisional of parent application Ser. No. 08/404,768, filed Mar. 15, 1995 now U.S. Pat. No. 5,573,877.

BACKGROUND OF THE INVENTION

The present invention relates to an exposure method to be used in manufacturing semiconductor devices or liquid crystal displays and an exposure apparatus for carrying out the method.

Proximity exposure methods are used to transfer a mask pattern of a mask to photosensitive agent applied to a surface of a glass substrate (hereinafter referred to as substrate) or a wafer held in proximity to the mask by irradiating the mask by a light beam emitted by a light source positioned above the mask. Comparing the proximity exposure methods with projection exposure methods, the former can be carried out at a lower cost than the latter because the former do not require a complicated lens system or a stage which can be operated with high accuracy. Further, unlike contact exposure methods, the mask does not contact the substrate in the proximity exposure methods. Thus, the photosensitive agent can be prevented from being damaged or torn off from the substrate, and hence, failure does not occur. In the proximity exposure methods, the resolution of an image formed by transfer depends greatly on the gap between the mask and the substrate.

Supposing that the wavelength of a light beam emitted by a light source is $\lambda$ and the gap between the mask and the substrate is (g), a minimum line width (ds) of the image formed by transfer is expressed as follows:

$$ds = \sqrt{2\lambda g}$$

In order to resolve a line having a width of approximately 3 μm by using a mercury lamp as a light source, it is necessary to adjust the gap between the mask and the substrate to as close as approximately 10 μm. Generally, the substrate is wavy in an extent of approximately 10 μm through 20 μm. Thus, it is necessary to adjust the gap between the mask and the substrate very precisely in consideration of this waviness. To this end, a complicated construction is required. A method of using a substrate-flattening chuck for keeping the upper surface of the substrate flat by deforming it is known as disclosed in Japanese Laid-Open Patent Publication No. 59-17247.

An example of a conventional proximity exposure method and a conventional apparatus for carrying out the proximity exposure method are described below with reference to FIG. 20.

In the conventional proximity exposure apparatus essentially, there are provided an exposure station 115 and a height-measuring station 116. In detail, the apparatus comprises a guide rail 112 constituting the base of the apparatus; a mask height-measuring device 114 installed on the guide rail 112 and movable in an X-direction along the guide rail 112 in sliding contact therewith; an X-stage 11 installed on the guide rail 112 and movable in the X-direction along the guide rail 112 in sliding contact therewith; a Z-stage 110 connected with the X-stage 111; a flattening chuck 109 installed on the Z-stage 110; a plurality of vertically movable elements 118 provided inside the flattening chuck 109; a substrate 20 sucked to and held by the flattening chuck 109; a mask 21 held in proximity to the substrate 20; a mask chuck 18 for sucking the mask 20 thereto and holding it thereon; an alignment scope 19 fixed to an upper portion positioned above the mask 21; a substrate height-measuring device 113 installed at a position opposed to the substrate 20; a mercury lamp 11; a reflection mirror 12; a fly eye lens 103; a condensing lens 104; a substrate stage 117 composed of the flattening chuck 109, the Z-stage 110, and the X-stage 111.

The operation of the conventional proximity exposure apparatus having the above-described construction is described below.

The substrate stage 117 on which the substrate 20 has been placed is moved to the height-measuring station 116 along the guide rail 112. Then, the substrate height-measuring device 113 installed above the substrate 20 measures the height of the upper face of the substrate 20. The mask height-measuring device 114 moves to the exposure station 115 along the guide rail 112, thus measuring the height of the lower face of a mask 21. Based on the measured values, the level of the vertically movable elements 118 provided inside the flattening chuck 109 and that of the Z-stage 110 are adjusted so as to set a gap between the mask 21 and the substrate 20 at respective measured positions to a desired value. Then, the substrate stage 117 is moved to the exposure station 115, and the substrate 20 and the mask 21 are placed in position by using the alignment scope 19'. A light beam emitted by the mercury lamp 11 is reflected by the reflection mirror 12 to guide it to the fly eye lens 103 to make the diameter thereof uniform. Then, the light beam is adjusted to be parallel to expose the photosensitive layer formed on the substrate 20 to a light beam through the mask 21 supported by the mask holder 18.

The above-described conventional proximity exposure apparatus having the construction is an exposure type apparatus in which a substrate is exposed to a light beam through a mask by one exposure operation. Thus, it is difficult to compensate the magnification of the mask pattern. In addition, it is necessary to provide the apparatus with the height-measuring station 116 separately from the exposure station 115. Thus, the apparatus is large. Moreover, if the large substrate 20 is used, it is necessary to use the condensing lens having a large diameter. Hence, the apparatus is manufactured at a high cost. Further, the mechanical accuracy of the guide rail is important for accurately measuring the gap between the substrate 20 and the mask 21.

SUMMARY OF THE INVENTION

Accordingly, an object of the present invention is to provide an improved exposure method capable of compensating the magnification of a mask pattern of a mask and forming an image of the mask pattern having a high resolution on a photosensitive layer of a substrate by exposing the photosensitive layer to a light beam and to provide a compact and inexpensive exposure apparatus for carrying out the exposure method.

In accomplishing the above and other objects, according to a first aspect of the present invention, there is provided an exposure method for irradiating a mask from above the mask held in proximity to a substrate to transfer a mask pattern of the mask to a photosensitive layer of the substrate by exposing the photosensitive layer to a light beam, comprising the steps of:

measuring, by a gap-measuring device, a gap between a portion of the mask locally scanned and irradiated and a portion of the substrate locally irradiated;

comparing a value measured by the gap-measuring device with a preset value; and deforming the mask and/or the substrate locally according to a difference between the value measured by the gap-measuring device and the preset value so as to cause the gap to approach a predetermined value.

According to a second aspect of the present invention, there is provided an exposure apparatus for irradiating a mask from above the mask held in proximity to a substrate to transfer a mask pattern of the mask to the substrate by exposing the substrate to a light beam, comprising:

a locally-irradiating means, for scanning the mask from above the mask, having a mask-deforming means for flexing the mask locally by a static pressure so as to cause the mask and the substrate to relatively approach each other;

a gap-measuring means for measuring a gap between the mask and the substrate at a portion of the mask irradiated by the locally-irradiating means and at a portion of the substrate irradiated thereby; and a control means for controlling the mask-deforming means, based on a value measured by the gap-measuring means and a preset value.

According to a third aspect of the present invention, there is provided an exposure apparatus for irradiating a mask from above the mask held in proximity to a substrate to transfer a mask pattern of the mask to the substrate by exposing the substrate to a light beam, comprising:

a locally-irradiating means for scanning the mask from above the mask;

a gap-measuring means for measuring a gap between the mask and the substrate at a portion of the mask irradiated by the locally-irradiating means and at a portion of the substrate irradiated thereby;

a chuck comprising a slight-moving means for sucking and holding the substrate and vertically moving a portion of the mask to be irradiated by the locally-irridating means so as to cause the substrate and the mask to approach each other locally; and a control means for controlling the slight-moving means based on a value measured by the gap-measuring means and a preset value.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
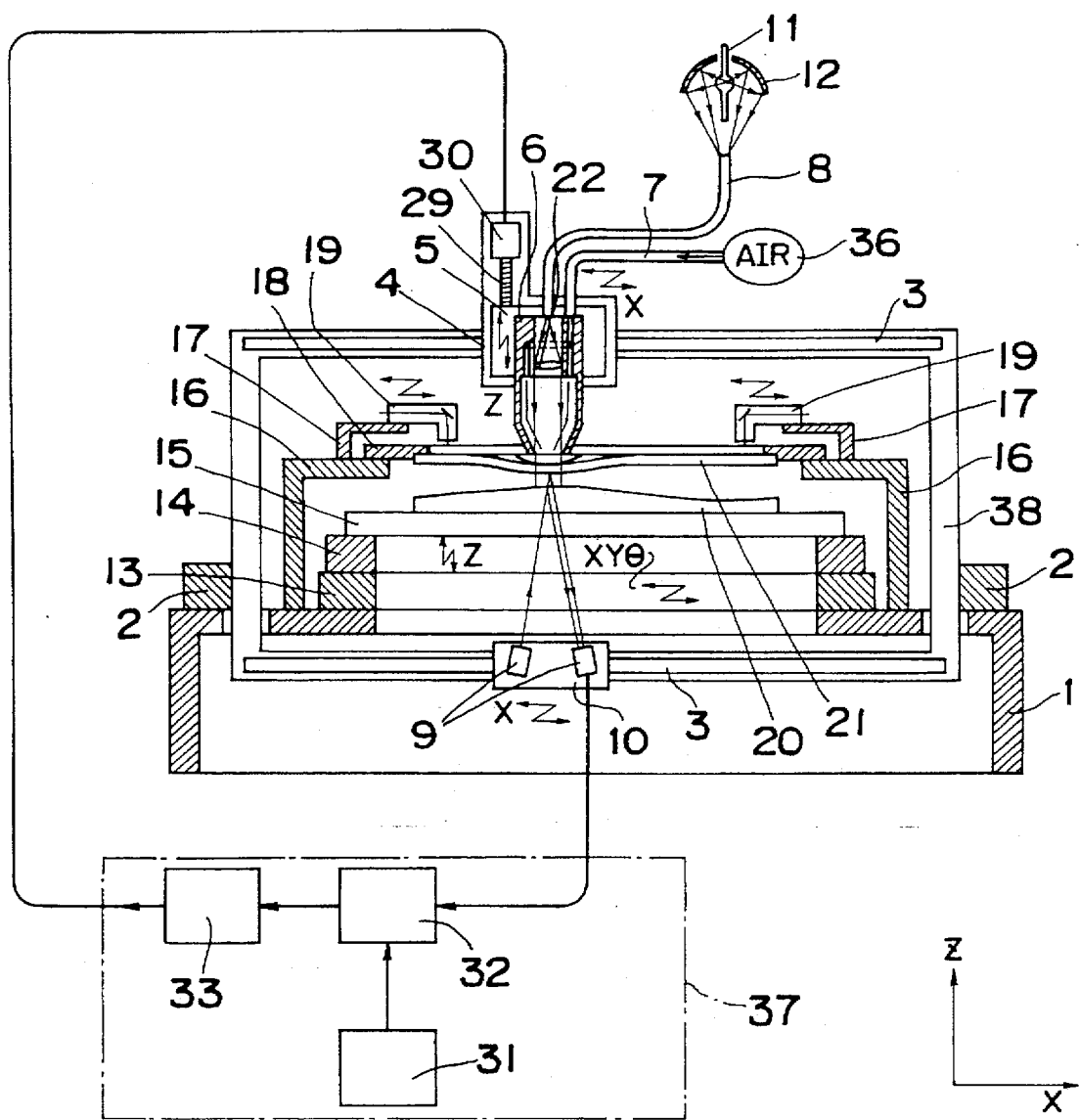
FIG. 1 is a sectional view showing an exposure apparatus according to a first embodiment of the present invention.

Before the description of the present invention proceeds, it is to be noted that like parts are designated by like reference numerals throughout the accompanying drawings.

Figure 2:
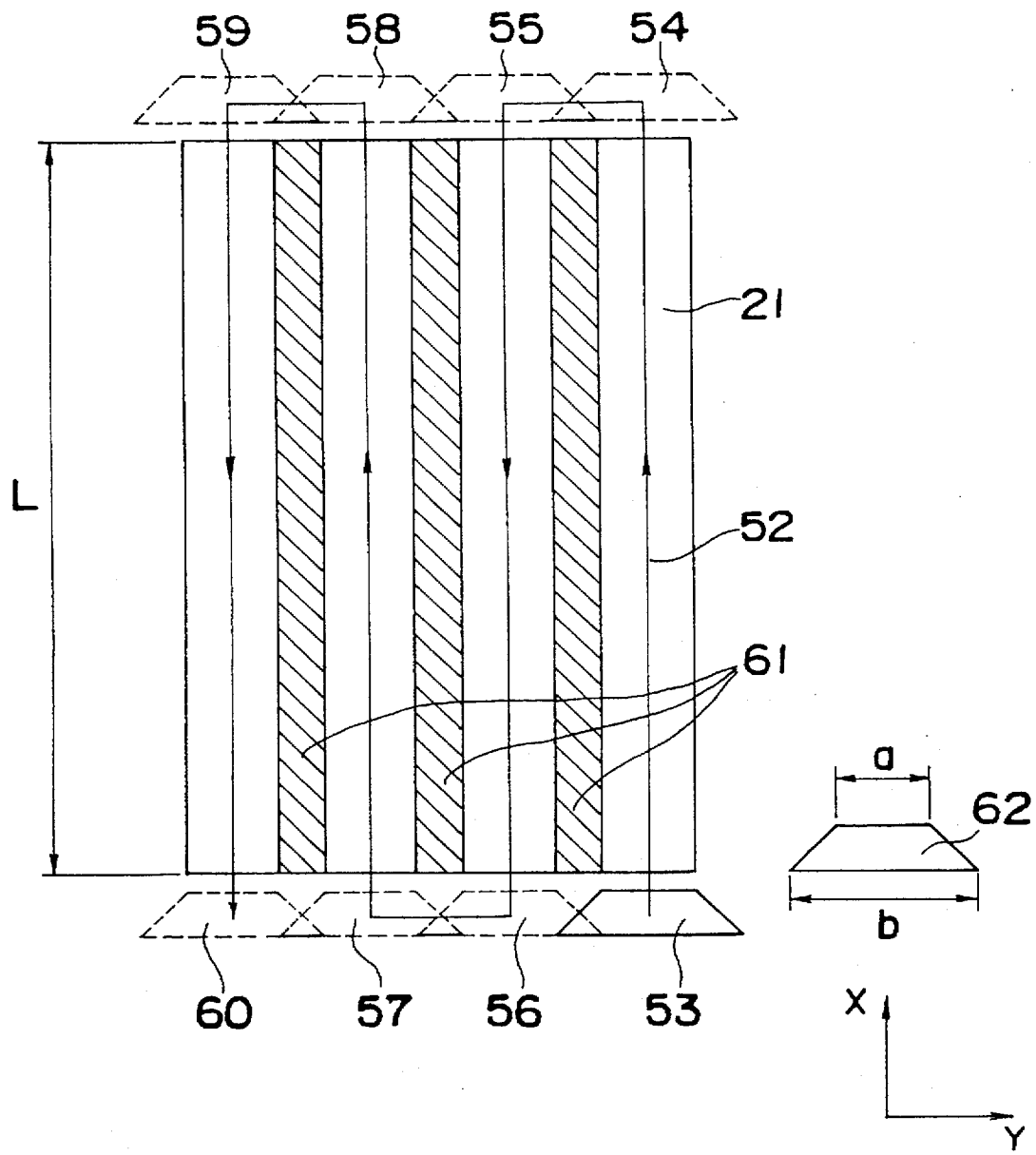
FIG. 2 is a view showing the sectional configuration of a light beam projected by a locally-irradiating means and a scanning path according to the first embodiment of the present invention.

An exposure method and an exposure apparatus according to a first embodiment of the present invention are described below with reference to FIGS. 1 and 2. FIG. 1 is a sectional view showing an exposure apparatus according to the first embodiment of the present invention. FIG. 2 is a view showing the sectional configuration of a light beam projected by a locally-irradiating means and a scanning path according to the first embodiment of the present invention.

Referring to FIG. 1, the exposure apparatus is constructed as follows. A Y-axis guide 2 is fixed to a frame 1. A Y-stage 38 is installed on the Y-axis guide 2 and is movable in a Y-direction in sliding contact therewith. An X-axis guide 3 is fixed to the Y-stage 38. An X-stage 4 is installed on the X-axis guide 3 and is movable in an X-direction in sliding contact therewith. An irradiation Z-stage 5 is installed on the X-stage 4 and is movable in a Z-direction in sliding contact therewith. A servo motor 30 is fixed to the X-stage 4. One end of a ball thread 29 is connected with the irradiation Z-stage 5 and the other end thereof is connected with the servo motor 30. A locally-irradiating means 6 is fixed to the irradiation Z-stage 5. One end of an air pressure pipe 7 is connected with the locally-irradiating means 6 and the other end thereof is connected with an air pressure source 36. One end of an optical fiber 8 is connected with the locally-irradiating means 6. A reflection mirror 12 condenses light beams emitted by a mercury lamp 11. A lens 22 is fixed to the inside of the locally-irradiating means 6. A sensor-provided X-stage 10 is installed on the X-axis guide 3 and is movable in the X-direction in sliding contact therewith. A gap-measuring means 9 is fixed to the sensor-provided stage 10. An XYθ stage 13 is installed on the frame 1 and is movable in an XY-plane in sliding contact therewith. A Z-stage 14 is installed on the XYθ stage 13 and is movable in the Z-direction. A chuck 15 is fixed to the Z-stage 14. A substrate 20 is sucked to and held by the chuck 15. One end of a mask frame 16 is fixed to the frame 1 and the other end thereof is connected with a mask chuck 18. A mask 21 is sucked to and held by the mask chuck 18. One end of each of two brackets 17 is connected with the mask frame 16 and the other end thereof is installed on an alignment scope 19 such that the other end is movable in the X-direction in sliding contact therewith. A control means 37 comprises a gap-setting device 31, a controller 32, and a servo motor driver 33. One end of the control means 37 is connected with the gap-measuring means 9 and the other end thereof is electrically connected with the servo motor 30.

Referring to FIG. 2, reference numeral 52 denotes a scanning path in locally irradiating the mask 21. Reference numeral 61 denotes a boundary of light beams. Reference numerals 53, 55, 57, and 59 denote start points of first through forth exposure lines. Reference numerals 54, 56, 58, and 60 denote termination points of the first through forth exposure lines.

The operation of the exposure apparatus having the above-described construction is described below. Scanning and exposure to be carried out by local irradiation are described below.

Light beams emitted by the mercury lamp 11 are condensed by the reflection mirror 12 and then guided to one end of the optical fiber 8. Light fluxes which have left the other end of the optical fiber 8 are adjusted to be parallel with each other by the lens 22 in the locally-irradiating means 6 to irradiate the mask 21. The locally-irradiating means 6 irradiates the entire surface of the mask 21 held over the substrate 20 proximate to the mask 21 and placed at an appropriate position relative to the substrate 20 by using the alignment scopes 19, while the locally-irradiating means 6 is being moved in the XY-plane above the mask 21 by the X-stage 4, the Y-stage 38, and unshown driving means thereof. The sectional configuration 62 of a light beam projected by the locally-irradiating means 6 is trapezoidal which is symmetrical with respect to a center line (symmetry axis) connecting the center of the upper side (a) and the lower side (b) of a trapezoid as shown in FIG. 2. The mask 21 is scanned in the direction (X-direction) of the symmetry axis of the trapezoid to expose the mask 21 to a light beam along the first exposure line. Then, the mask 21 is exposed to a light beam along the second exposure line in the direction opposite to the scanning direction along the first exposure line by scanning it in the direction of the symmetry axis, of an adjacent trapezoid, moved by a step of (a+b)/2 from the first exposure line in a direction (Y-direction) perpendicular to the symmetry axis. Supposing that the movement amount of the symmetry axis is dislocated by ΔY from a target position in the Y-direction, the nonuniform irradiation of the boundary 61 of the light beams is expressed by 2ΔY/(b−a). The nonuniform irradiation which occurs due to an error in the movement of the Y-stage 38 can be decreased by reducing the gradient of the inclined sides of the trapezoid and thus the entire surface of the mask 21 can be irradiated uniformly without an unexposed portion being formed thereon. A photosensitive layer of the substrate 20 is exposed to a light beam by moving the XYθ stage 13 slightly in the same direction as the scanning direction synchronously with each scanning performed by the locally-irradiating means 6 so as to accomplish an error distribution and further, adjustably magnify the mask pattern in transferring it to the photosensitive layer.

As one example of the substrate 20, the size thereof is 380 mm×480 mm and the thickness is 1.1 mm. As one example of the mask 21, the size thereof is 508 mm×10 mm and the thickness is 3.0 mm.

The method of allowing the gap between the mask 21 and the substrate 20 to be locally close to each other is described below. When the locally-irradiating means 6 is moved to a position over the mask 21 held in proximity to the substrate 20 by tens of microns by adjusting the level of the Z-stage 14, compressed air supplied by the air pressure source 36 is jetted from a nozzle provided on the outlet of the locally-irradiating means 6 via the air pressure pipe 7. Consequently, the mask 21 is locally deformed. Supposing that the air is jetted from the nozzle at a pressure (P) and that the sectional area of the nozzle is (S), a force is applied to the mask 21 at (PS). Supposing that the size of the mask 21 is 360 mm×465 mm and the thickness thereof is 4 mm, and that the sectional area of the nozzle is 4 $cm^2$, hundreds of grams are required per $cm^2$ to flex the mask 21 by tens of micrometers. The pressure (P) at the nozzle outlet depends on the distance between the nozzle tip and the mask 21. Thus, the pressure (P) is increased by moving the irradiation Z-stage 5 downward and hence, the deformation amount of the mask 21 increases.

Figure 5:
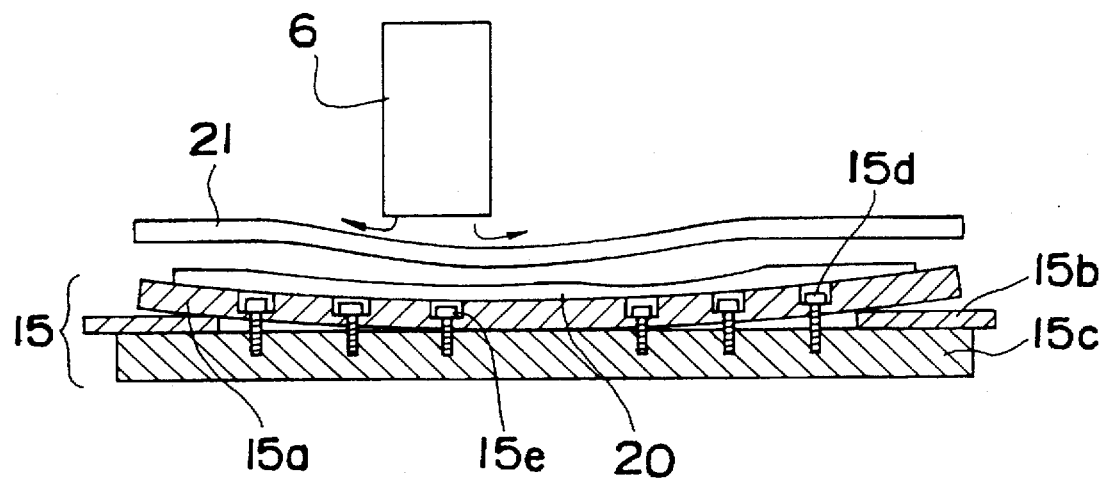
FIGS. 5 and 6 is a partially sectional side view and an exploded perspective view of one specific example of the chuck.
Figure 6:
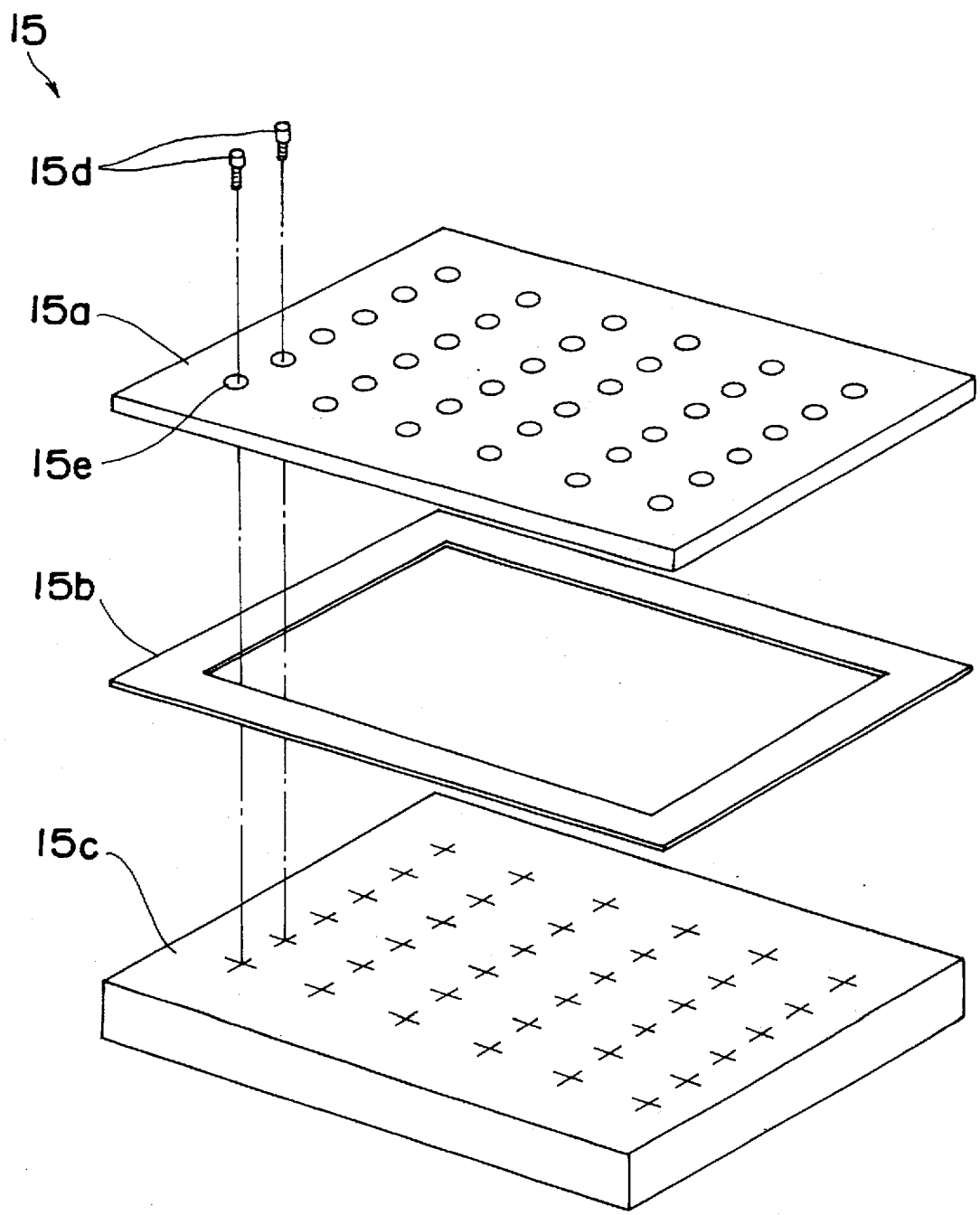

FIGS. 5 and 6 show one specific example of the chuck 15. The chuck 15 includes a base plate 15c, a shim 15b of square frame shape on the base plate 15c, and a substrate chuck 15a having many holes 15e on the shim 15b. The substrate chuck 15a is fixedly connected to the base plate 15c with many bolts 15d while holding the shim 15b between them. Thus, when the substrate 20 is placed on the substrate chuck 15a, the center portion of the substrate 20 is lowered, for example, by 150 μm as compared with other portion because of a space surrounded between the substrate chuck 15a and the base plate 15c by the shim 15b as shown in FIG. 5.

Figure 7:
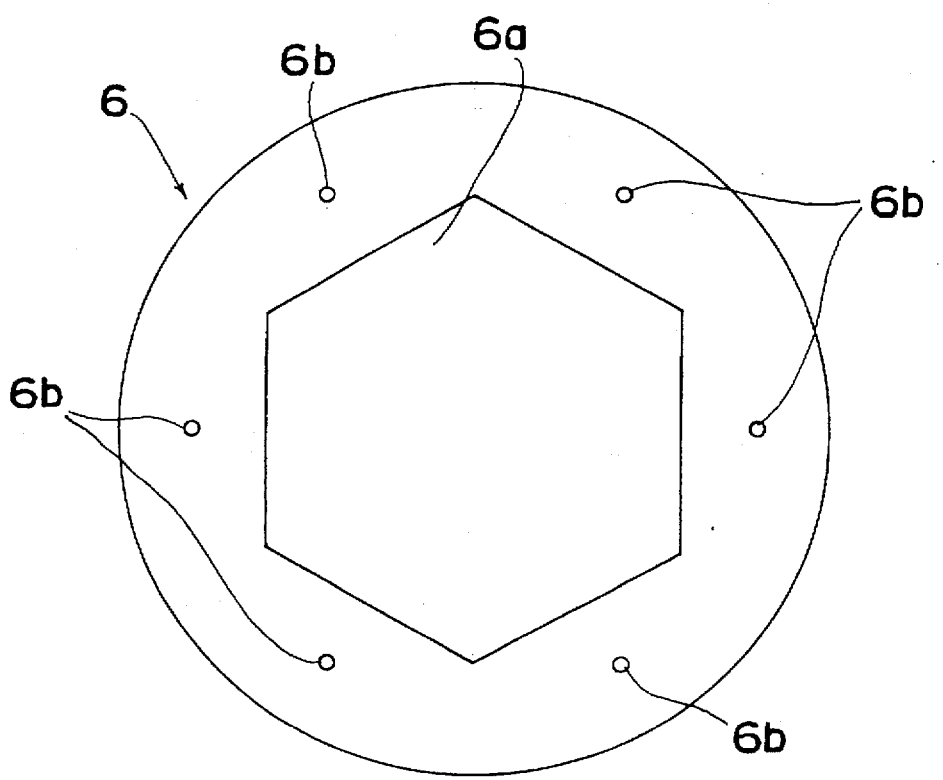
FIG. 7 is a bottom view of a nozzle of the locally-irradiating means.
Figure 8:
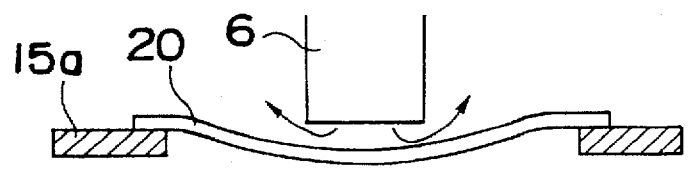
FIG. 8 is an explanatory view showing the static pressure applied to the substrate by the nozzle.

The nozzle has six through-holes 6b around a hexagonal opening 6a as shown in FIG. 7. The light beam is projected through the opening 6a. The air is jetted through the through-holes 6b via the air pressure source 36 and the air pressure pipe 7 to deform the portion of the mask 21 confronting the nozzle by static pressure as shown in FIGS. 5 and 8. As one example, when the nozzle is used at the center portion of the mask 21, the deforming amount of the mask 21 is 150 μm maximum at supplied pressure of 5 kgf/$cm^2$ and 10 μm-interval between the mask and the nozzle of FIG. 7. One example of the nozzle has a 102 mm-outer diameter, 56.3 mm-distance between confronting inner walls of the opening and the through-hole of a 0.3 mm-inner diameter.

Figure 9:
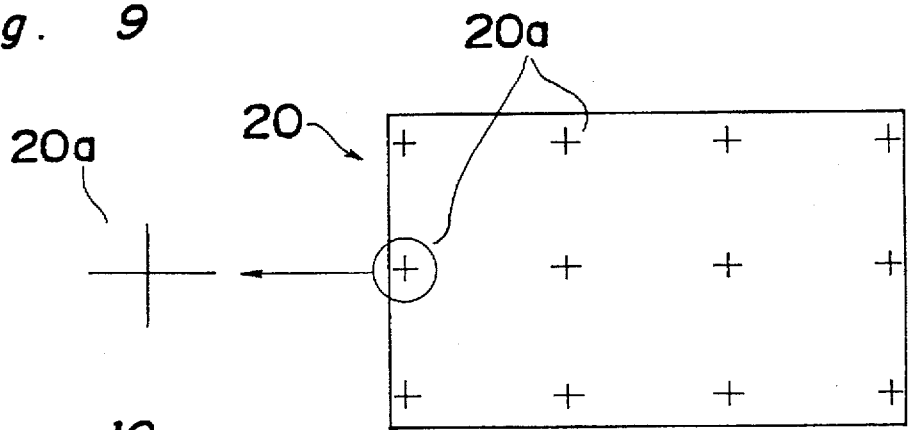
FIG. 9 is a plan view of the substrate with twelve cross-shaped alignment marks.
Figure 10:
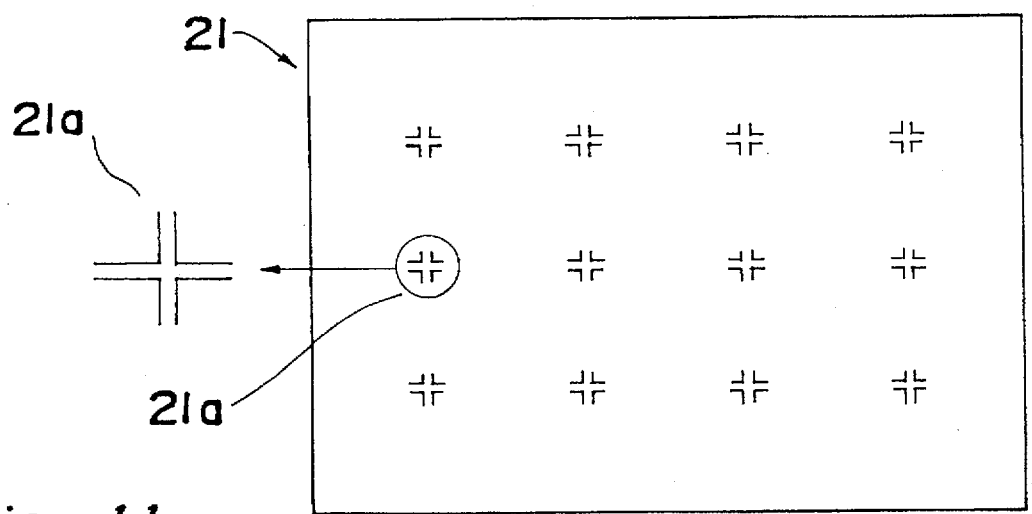
FIG. 10 is a plan view of the mask twelve cross-shaped alignment marks.
Figure 11:
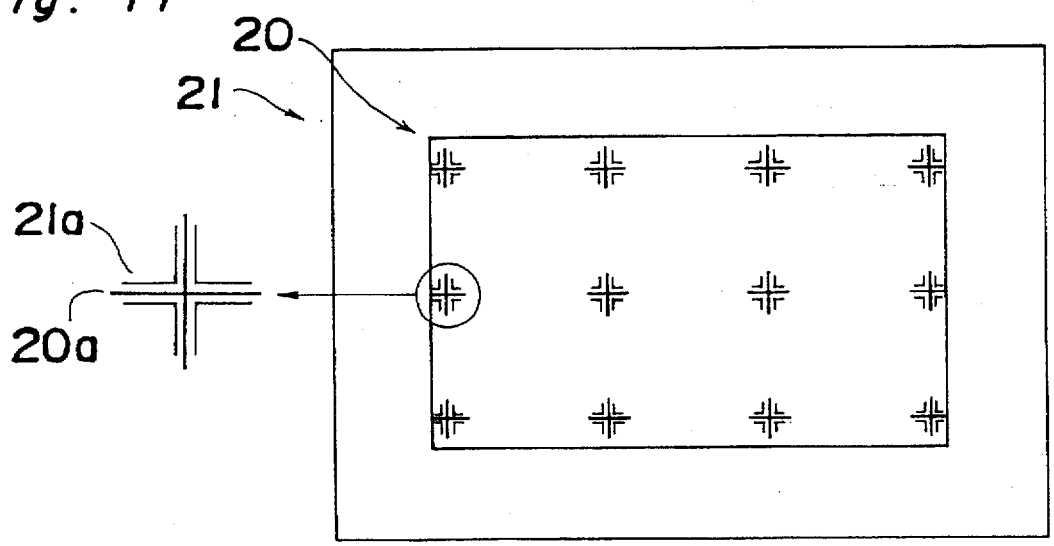
FIG. 11 is a plan view showing a condition where the substrate and the mask overlap each other.

The positioning method of the mask 21 and the substrate 20 is shown in FIGS. 9 through 11. The substrate 20 has twelve cross-shaped alignment marks 20a as shown in FIG. 9 and the marks 21 has twelve cross-shaped alignment marks 21a as shown in FIG. 10 in each of which each cross-shaped alignment marks 20a of the substrate 20 can be inserted. Then, when the mask 21 is positioned to the substrate 20, the mask 21 is adjusted to the substrate 20 so that the twelve cross-shaped alignment marks 20a of the substrate 20 can be inserted in the twelve cross-shaped alignment marks 21a of the mask 21 while viewing through the mask 21 as shown in FIG. 11.

The gap-measuring means 9 of laser reflection type measures the gap between the mask 21 and the substrate 20, thus outputting a signal indicating the length of the gap to the controller 32. The controller 32 compares the value of the signal and the value of a signal outputted thereto from the setting device 31 with each other. The controller 32 outputs a deviation signal to the servo driver 33. The servo driver 33 outputs a control signal to the servo motor 30 according to the value of the deviation signal. As a result, the irradiation Z-stage 5 is driven via the ball thread 29 so as to adjust the deformation amount of the mask 21. In this manner, the gap between the mask 21 and the substrate 20 can be allowed to be close to a predetermined length locally set. An image having a high resolution can be formed on the photosensitive layer of the substrate 20 by exposing it to a light beam.

As described above, according to the first embodiment, the exposure apparatus comprises the scan type locally-irradiating means 6 projecting the light beam trapezoidal in its sectional configuration 62 and having mask-deforming means comprising the air pressure source 36 and the air pressure pipe 7 for deforming the mask 21 by static pressure; the gap-measuring means 9 for measuring the gap between a portion of the mask 21 irradiated by the locally-irradiating means 6 and a portion of the substrate 20 irradiated thereby; the control means 37 for controlling the mask-deforming means 36 and 7 based on a value measured by the gap-measuring means 9 and a preset value; and the slight-moving mechanism comprising the XYθ stage 13 for moving the mask 21 and the substrate 20 relative to each other synchronously with the scanning of the locally-irradiating means 6. This construction allows the mask 21 to be scanned, with portions of to-be-irradiated regions thereof overlapped with each other at the boundary of adjacent scanning paths, thus facilitating the compensation even though the magnification of the mask pattern is inappropriate relative to the substrate, the inappropriate magnification can be compensated. Accordingly, the photosensitive layer can be exposed to a light beam uniformly and at a high resolution.

Figure 12:
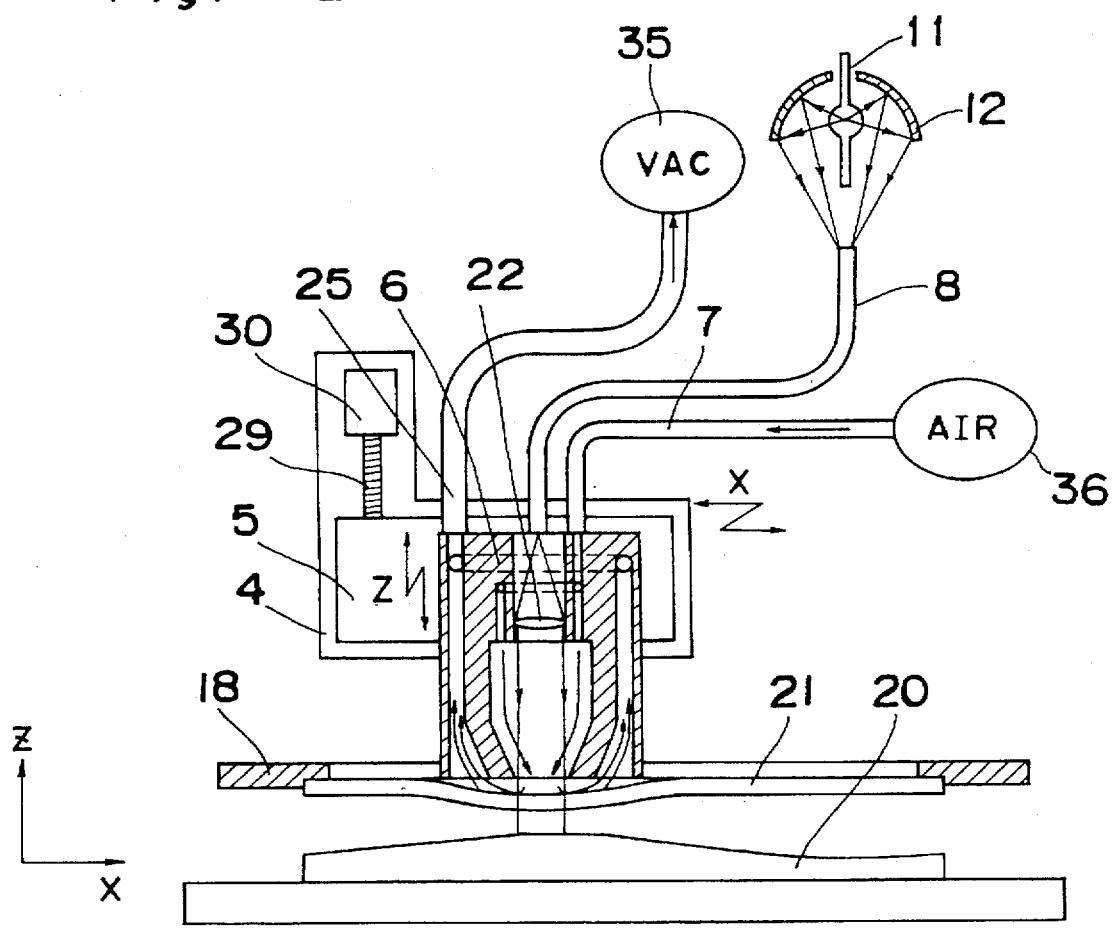
FIG. 12 is a partly enlarged sectional view showing an exposure apparatus according to a second embodiment of the present invention.

An exposure method and an exposure apparatus according to a second embodiment of the present invention are described below with reference to FIG. 12 showing the exposure apparatus by partly enlarging it. The second embodiment is different from the first embodiment in that ports are formed in the periphery of the locally-irradiating means 6, and the ports are connected with a vacuum source 35 via a vacuum pipe 25 so as to constitute suction ports. The suction ports are capable of lifting the periphery of a to-be-irradiated portion of the mask 21 by a negative pressure so as to deform the mask 21 more locally than the first embodiment. In this manner, the mask 21 and the substrate 20 can be positioned in proximity to each other to an extent greater than the first embodiment. As described above, The provision of the suction ports allows the photosensitive layer to be exposed to a light beam at a higher resolution. The other constructions of the apparatus according to the second embodiment are the same as those of the apparatus according to the first embodiment.

Figure 13:
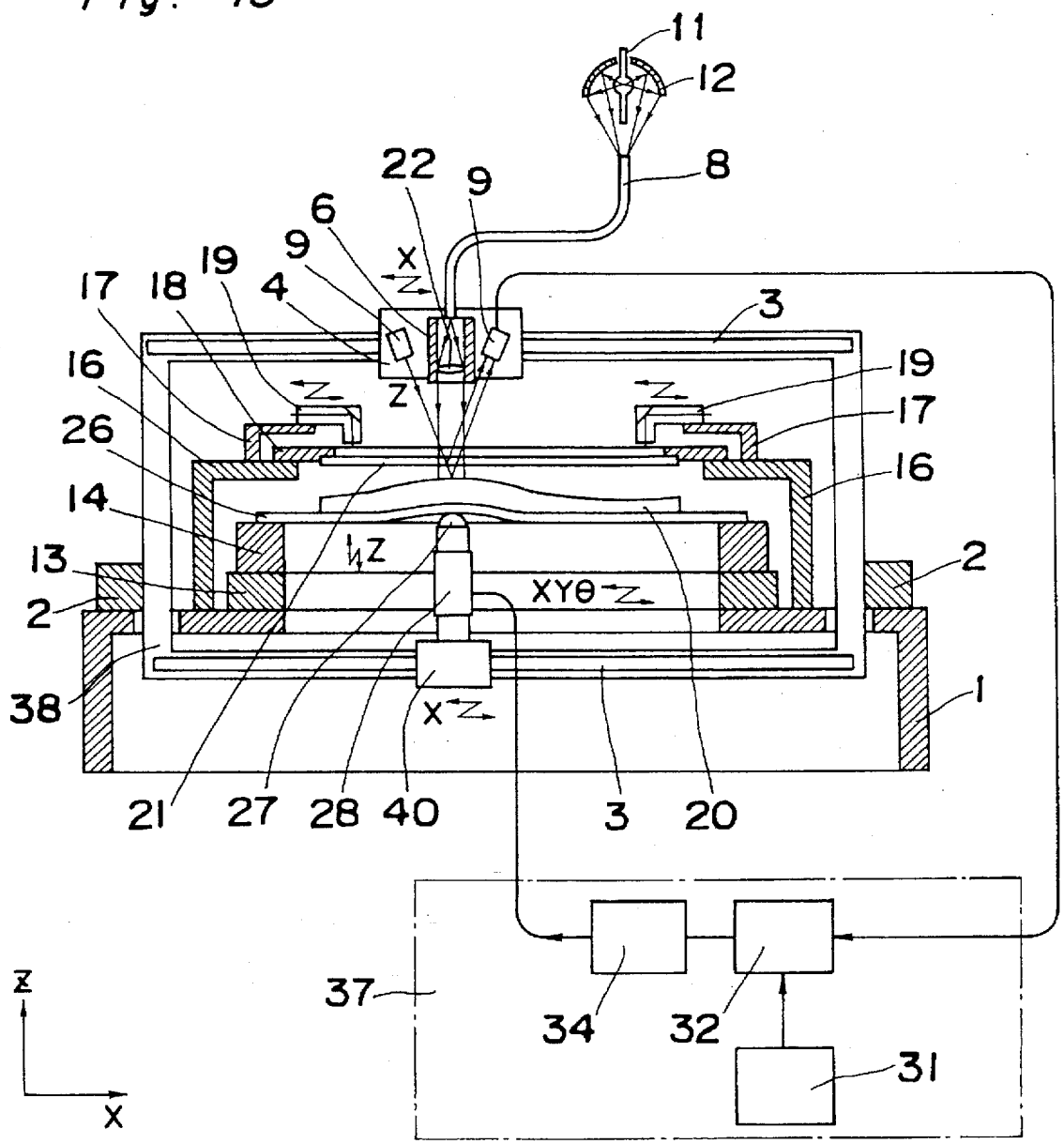
FIG. 13 is a sectional view showing an exposure apparatus according to a third embodiment of the present invention.
Figure 14:
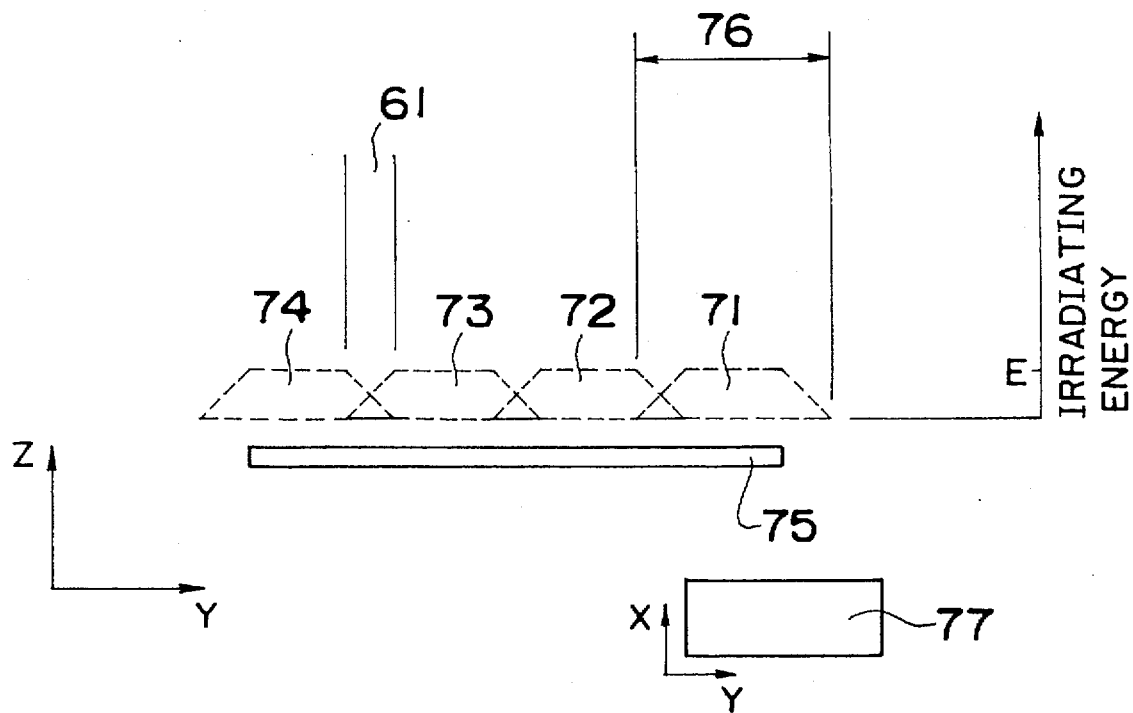
FIG. 14 is a view showing the sectional configuration of a light beam projected by a locally-irradiating means and an illuminance distribution.

An exposure method and an exposure apparatus according to a third embodiment of the present invention are described below with reference to FIGS. 13 and 14. FIG. 13 is a sectional view showing an exposure apparatus according the third embodiment. FIG. 14 is a view showing the sectional configuration of a light beam projected locally by the locally-irradiating means 6 to the mask 21 and an illuminance distribution. The third embodiment is different from the first embodiment in that not the mask 21 but the substrate 20 is deformed to cause the substrate 20 and the mask 21 to approach each other locally. An elastic chuck 26 made of an aluminum plate or a stainless steel plate is used instead of the chuck 15 of the first embodiment; a piezo-driver 34 is used instead of the servo motor driver 33 of the first embodiment; a piezo-X-stage 40 is provided instead of the X-stage 4 of the first embodiment; one end of a piezo-actuator 28 is connected with a roller 27; the other end of the piezo-actuator 28 is connected with the piezo-X-stage 40; and the gap-measuring means 9 and the locally-irradiating means 6 are fixed to the X-stage 4. The sectional configuration 77 of each light beam projected by the locally-irradiating means 6 is rectangular as shown in FIG. 14. The illuminance distribution of the light beam is trapezoidal as shown by reference numerals 71 through 74 of FIG. 14. This construction allows an output signal of the gap-measuring means 9 to be fed back to the piezo-actuator 28 via the control means 37, thus causing the substrate 20 and the mask 21 to approach each other locally, with a predetermined gap provided therebetween. This construction allows the photosensitive layer to be exposed to a light beam at a high resolution. The illuminance distribution of the light beam is trapezoidal as shown by reference numerals 71 through 74 of FIG. 14, which provides an advantage similar to that provided by the trapezoidal configuration of the light beam, thus allowing the photosensitive layer to be uniformly exposed.

Figure 3:
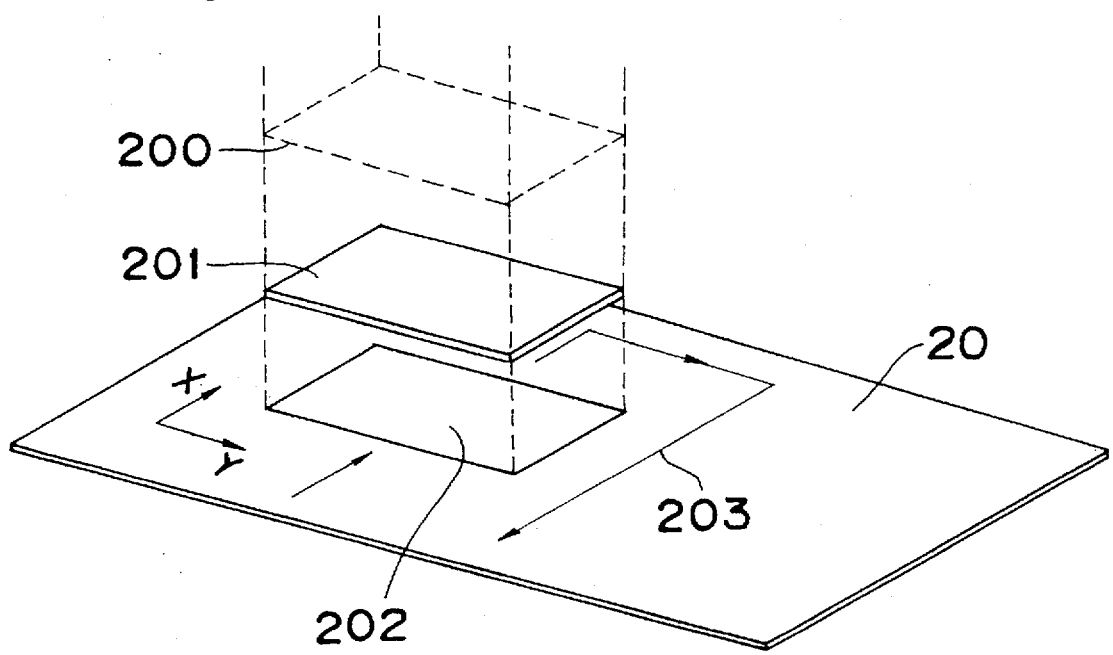
FIG. 3 is a perspective view of one specific example of the uniform exposure system of the locally-irradiating means so as to perform the exposure shown in FIG. 14.
Figure 4:
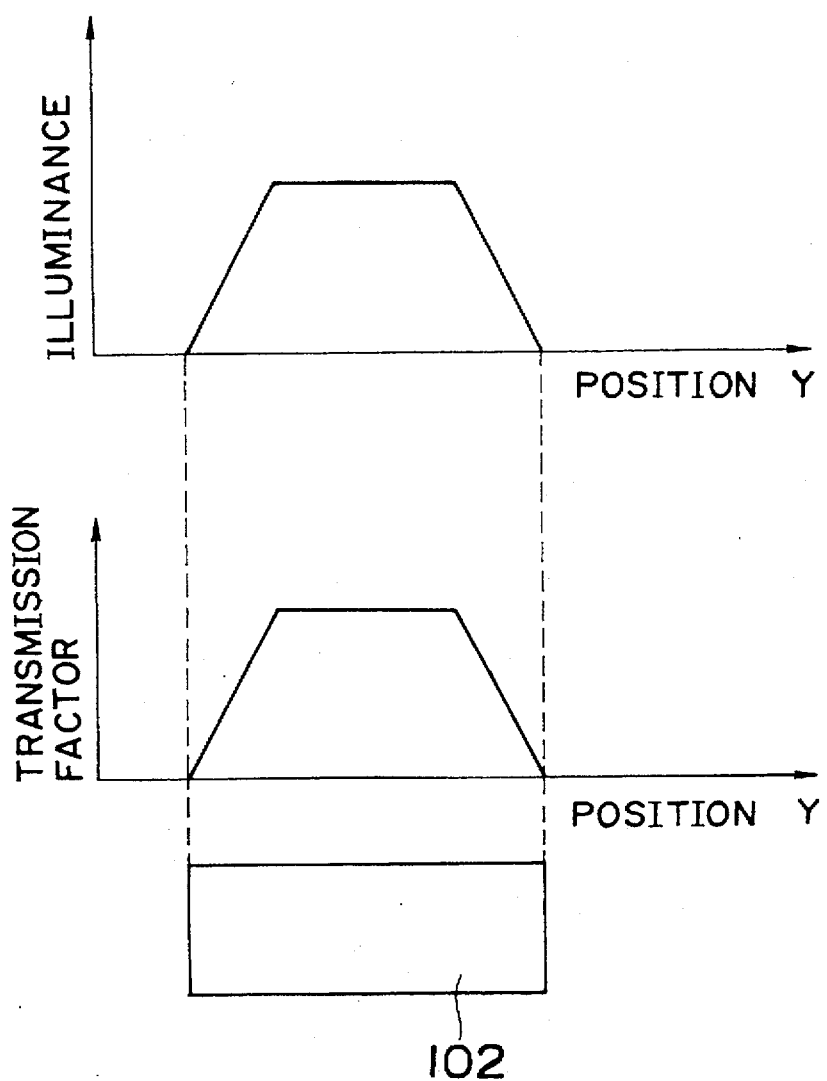
FIG. 4 shows examples of the illumination distribution of the exposure light beam indicating the relationship between the illumination and the position in the Y direction on the scanning area; the transmittance distribution of the ND filter indicating the relationship between the transmittance and the position in the Y direction; and the exposure area of the light beam.

FIG. 3 shows a perspective view of one specific example of the uniform exposure system of the locally-irradiating means 6 so as to perform the exposure shown in FIG. 14. In FIG. 3, the uniform light beam 200 from the lens 22 passes through an ND filter (neutral density filter) 201 to irradiate onto the substrate 20. Reference numeral 202 denotes an exposure area of the light beam and 203 denotes a scanning path of the light beam. FIG. 4 shows examples of the illumination distribution of the exposure light beam indicating the relationship between the illumination and the position in the Y direction on the scanning area; the transmittance distribution of the ND filter) 201 indicating the relationship between the transmittance and the position in the Y direction; and the exposure area 202 of the light beam. That is, the ND filter 201 having the above trapezoidal transmittance distribution is arranged between the lens 22 and the substrate 20 to form the light beam having the rectangular sectional configuration 77 and having the trapezoidal irradiation energy shown in FIG. 14.

As described above, according to the third embodiment, the sectional configuration 62 of a light beam is trapezoidal. The exposure apparatus comprises the scan type locally-irradiating means 6 projecting the light beam having the trapezoidal configuration in the illuminance distribution; the gap-measuring means 9 for measuring the gap between a portion of the mask 21 irradiated by the locally-irradiating means 6 and a portion of the substrate 20 irradiated thereby; the chuck 26 comprising the piezo-actuator 28 serving as the slight-moving means for sucking the substrate 20 and holding it thereon and moving a to-be-irradiated portion of the mask 21 vertically so as to approach the substrate 20 and the mask 21 to each other locally; the control means 37 for controlling the slight-moving means 28 based on a value measured by the gap-measuring means 9 and a preset value; and the slight-moving mechanism comprising the XYθ stage 13 for moving the mask 21 and the substrate 20 to each other synchronously with the scanning of the locally-irradiating means 6. This construction allows the mask 21 to be scanned, with portions of to-be-irradiated regions thereof overlapped with each other at the boundary of adjacent scanning paths, thus facilitating the compensation of the magnification of the pattern mask. Accordingly, the photosensitive layer can be exposed to a light beam uniformly and at a high resolution.

Figure 15:
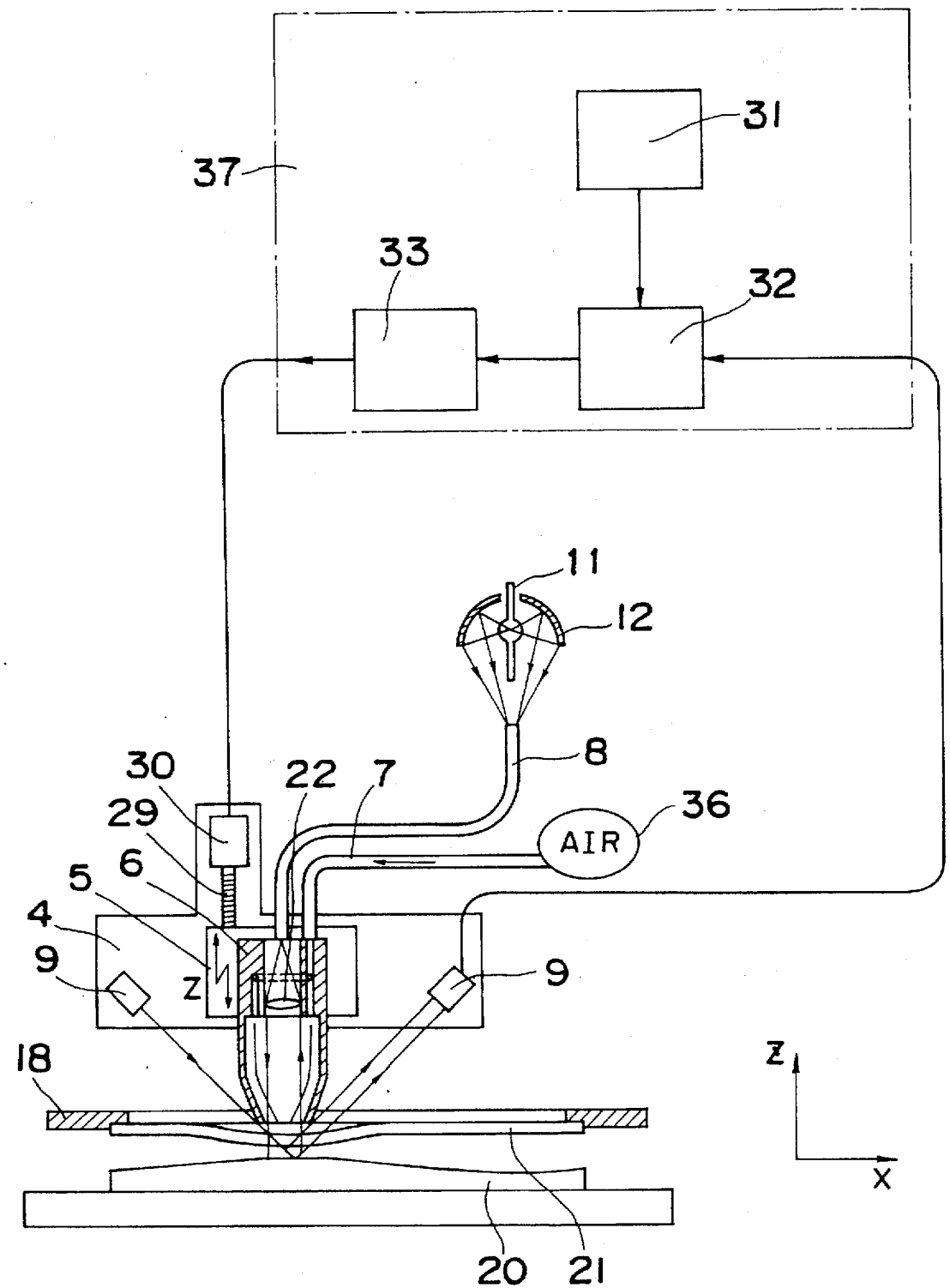
FIG. 15 is a partly enlarged sectional view showing a modification in which the position of a gap-measuring means according to the first embodiment is altered.

The sectional configuration 62 of the light beam is trapezoidal in the first embodiment, but needless to say, it may be parallelorgammatic or hexagonal. The gap-measuring means 9 is installed on the sensor-provided X-stage in the first embodiment, but it may be installed on the X-stage 4 as shown in FIG. 15. Although the XYθ stage 13 is used to cause the substrate 20 and the mask 21 to approach each other, with a predetermined gap provided therebetween in the first embodiment, the moving means may be provided on the mask side. Although the irradiation Z-stage 5 to be driven by the servo motor 30 via the ball thread 29 is provided as the means for adjusting the static pressure (P) in the first and second embodiments, a pressure adjusting means for controlling the pressure of compressed air to be supplied from the air pressure source 36 may be provided. Needless to say, the pressure adjusting means provides an advantage similar to that provided by the irradiation Z-stage 5.

Figure 16:
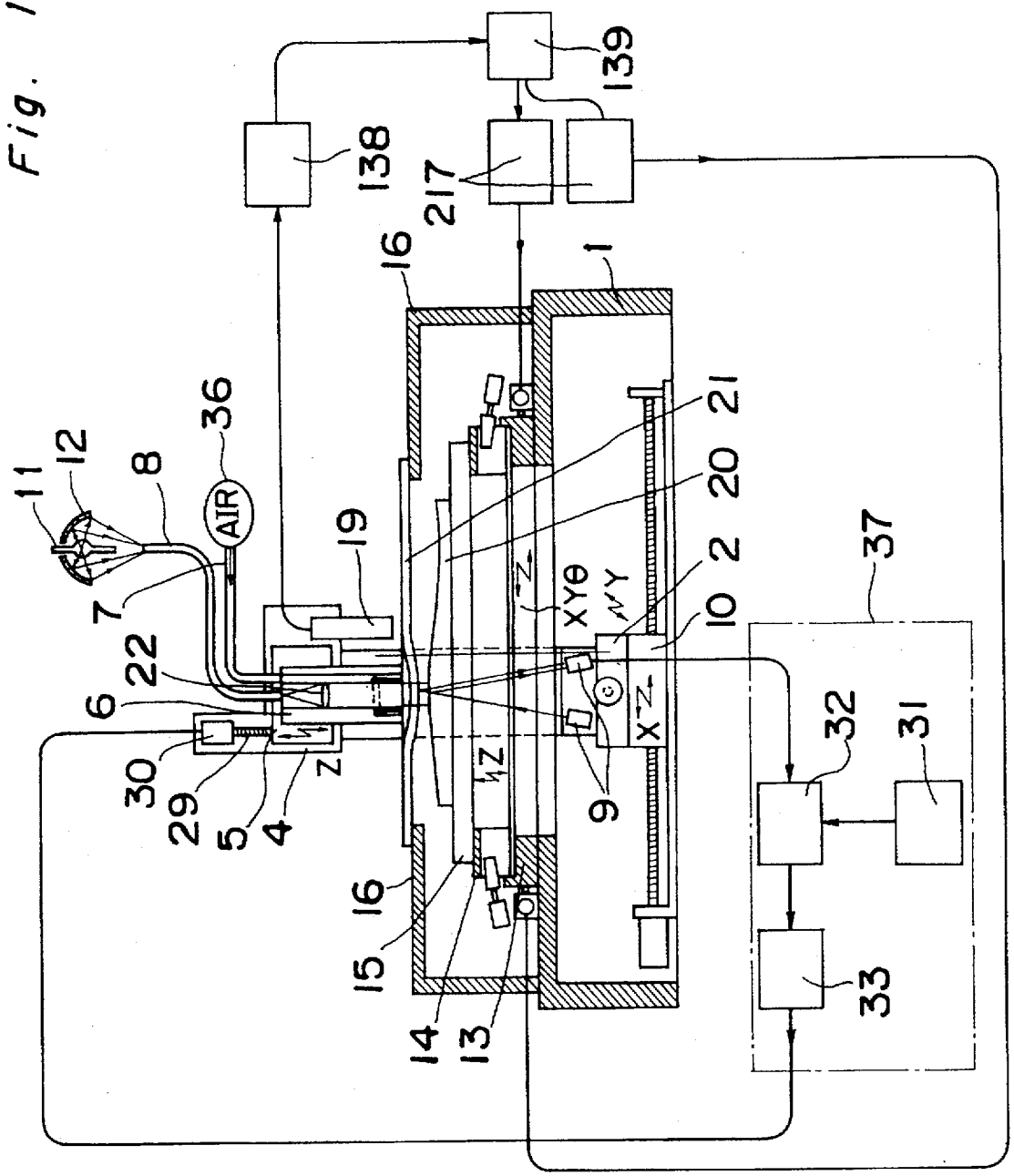
FIG. 16 is a partly enlarged sectional view showing a modification in which the alignment scope according to the first embodiment is provided at the locally-irradiating means.

Although the alignment scopes 19 are fixed to the upper portion positioned above the mask 21 in the embodiments, one alignment scope 19 can be provided at the locally-irradiating means 6 as shown in FIG. 16. FIG. 16 shows the control system of the XYθ stage 13 as a result of the detection of the alignment scope(s) 19 which can be applied to the above embodiments. According to the control system, the alignment scope 19 is connected to an image processing device 138 for processing images of the alignment marks 20a and 21a of the substrate 20 and mask 21 picked-up through the alignment scope 19. The result of the processing is outputted from the image processing device 138 to a controller 139 for controlling motor drivers 217 of the XYθ stage 13.

According to the embodiments, the mask and the substrate are locally irradiated. Thus, it is unnecessary to use a condensing lens having a large diameter. The mask and/or the substrate are locally deformed at each scanning position thereof, with the mask and the substrate held in proximity to each other locally, based on a value measured by the gap-measuring means so as to allow the gap between the mask and the substrate to be coincident with a preset value. Therefore, the gap can be reliably allowed to be coincident with the preset value in the entire region to be exposed to a laser beam, and hence, an image having a high resolution can be formed on the substrate by exposing the photosensitive layer of the substrate to a light beam.

According to the embodiments, the exposure apparatuses being compact and having a simple construction and capable of resolving the pattern mask at a high resolution can be provided.

According to the embodiment, the photosensitive layer is exposed to a light beam by moving the mask and the substrate relative to each other to a slight extent, synchronously with each scanning performed by the locally-irradiating means. Therefore, it is possible to distribute an error which may occur due to an inappropriate magnification of the mask pattern relative to the substrate so as to compensate the inappropriate magnification of the mask pattern.

According to the embodiment, although the locally-irradiating means of scan type is used, the mask is scanned, with portions of to-be-irradiated regions thereof overlapped with each other at the boundary of adjacent scanning paths so as to distribute irradiation energy uniformly to the entire region of the mask to be irradiated. Accordingly, the entire photosensitive layer can be exposed to a light beam uniformly.

Figure 17:
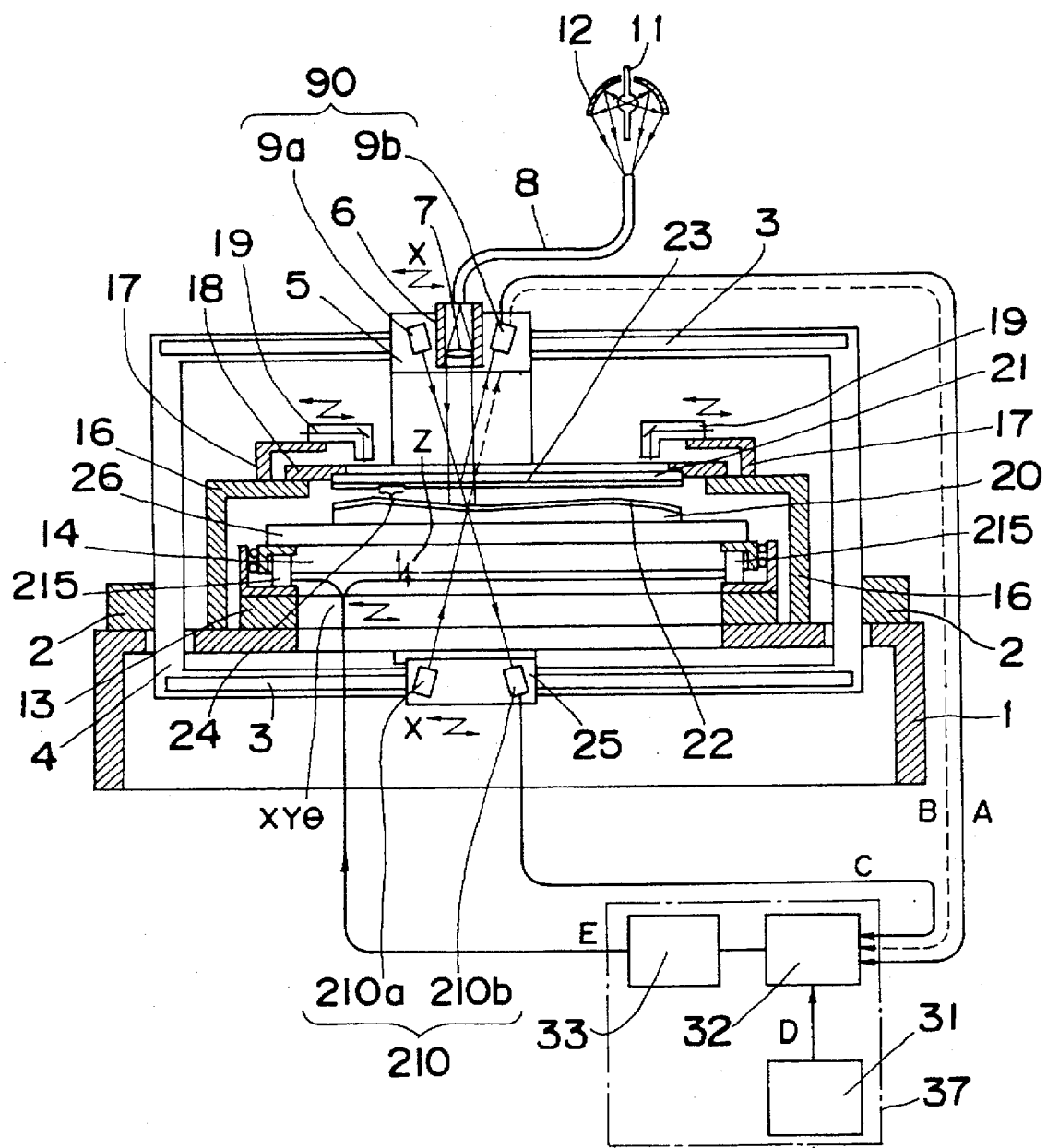
FIG. 17 is a sectional view showing an exposure apparatus according to a fourth embodiment of the present invention.
Figure 18A:
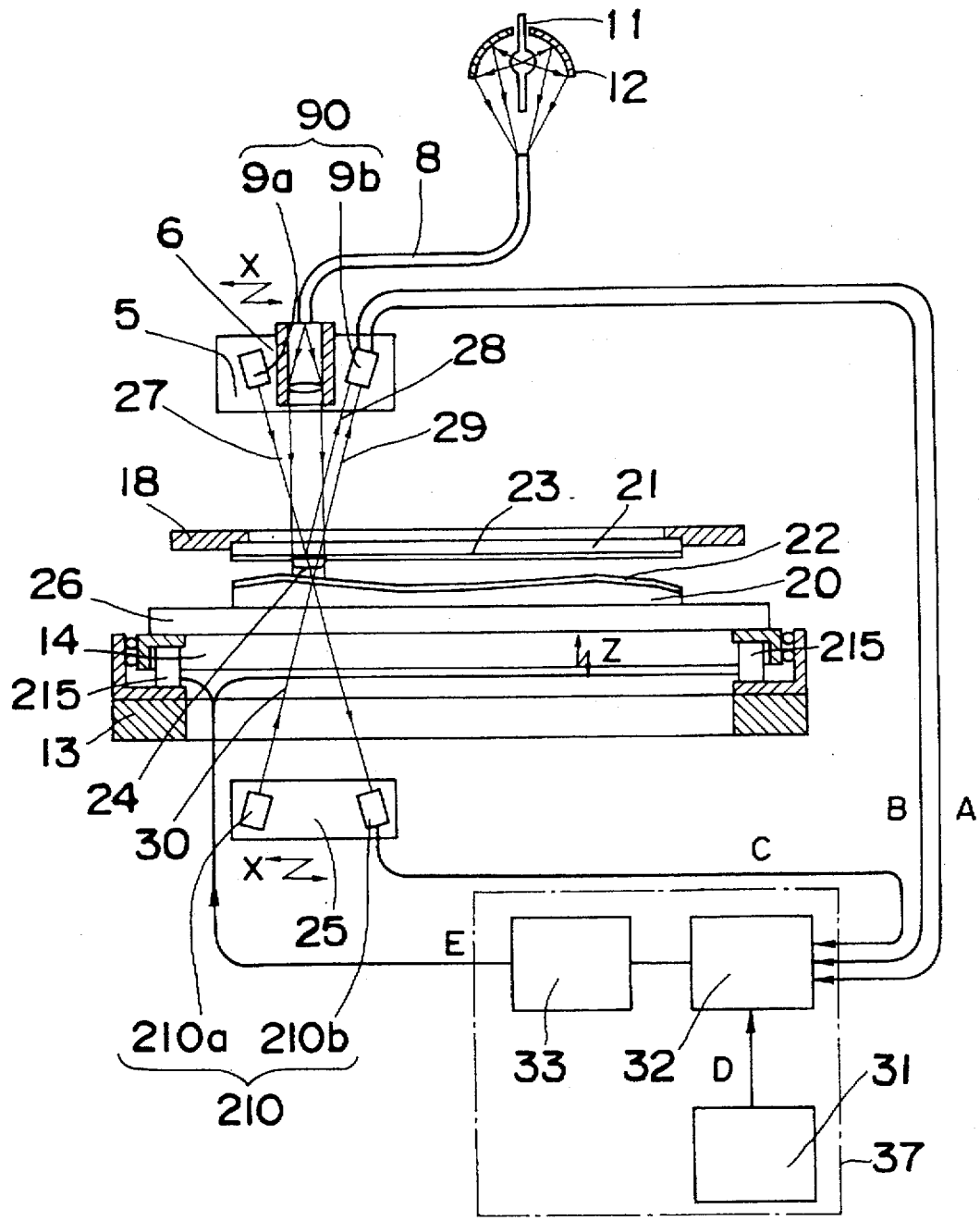
FIG. 18A is a partially enlarged view of the exposure apparatus for explaining a calibration function.
Figure 18B:
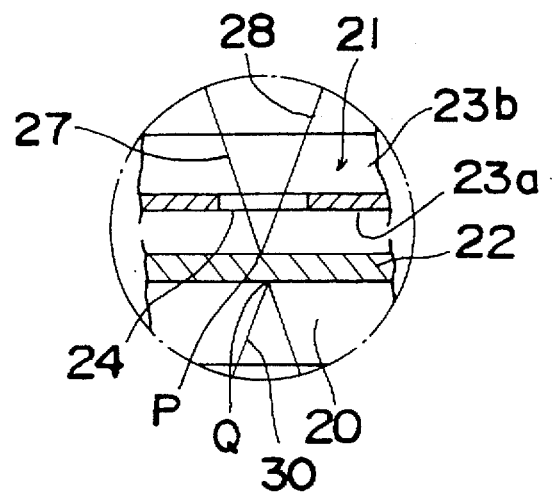
FIG. 18B is an enlarged view of a part of FIG. 18A.
Figure 19:
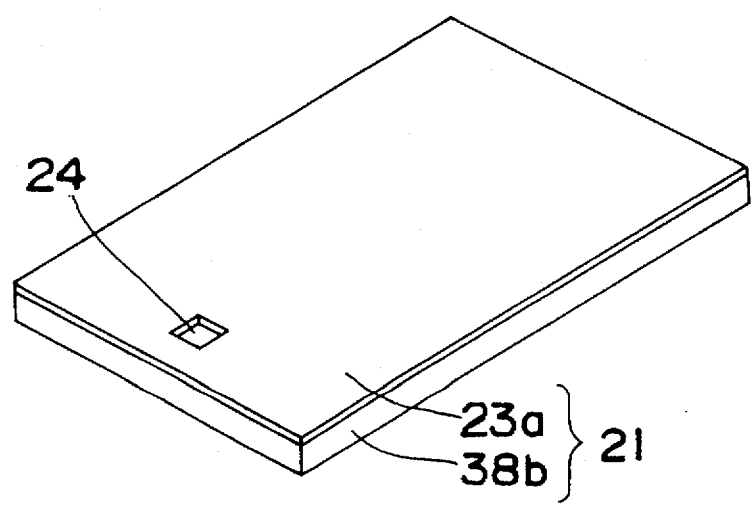
FIG. 19 is a perspective view showing a mask.
Figure 20:
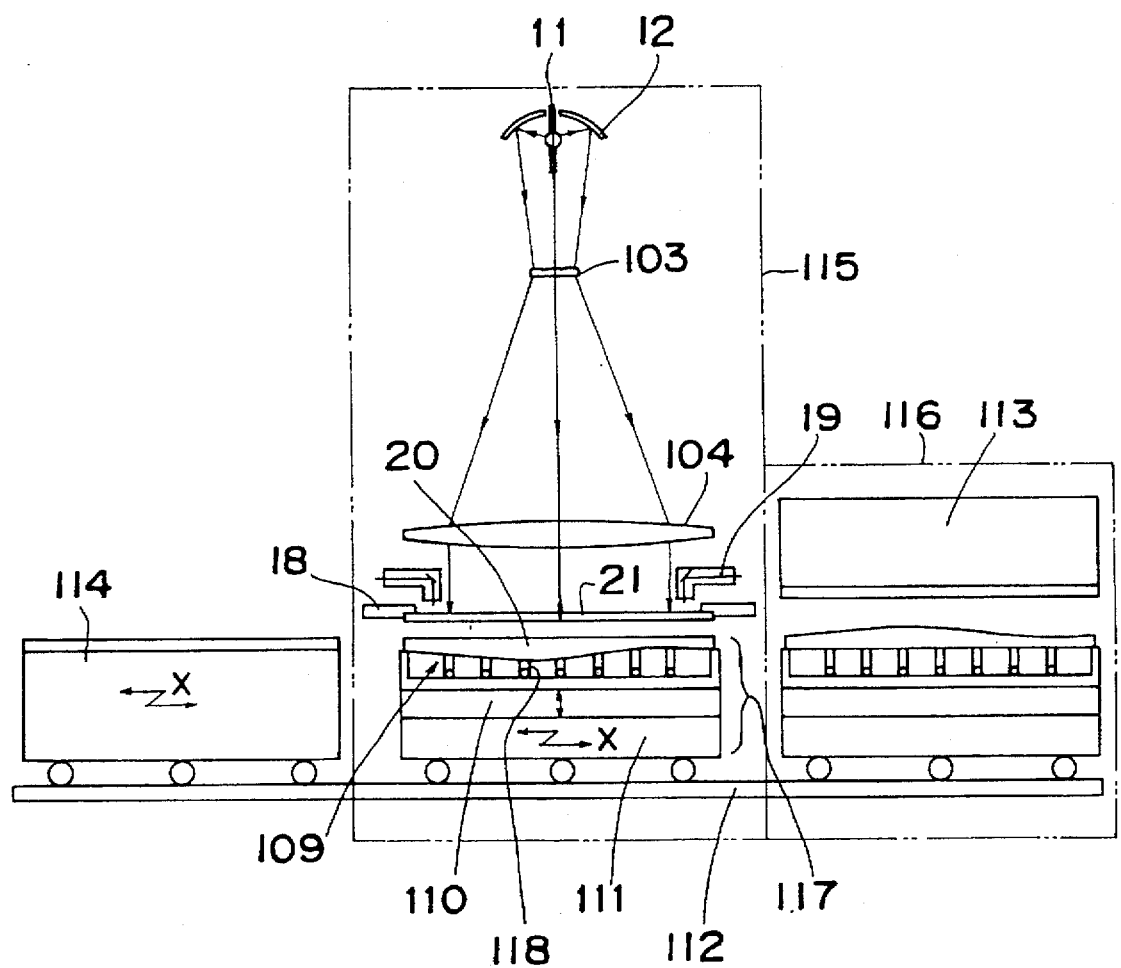
FIG. 20 is a schematic view showing a conventional proximity exposure apparatus.

An exposure method and an exposure apparatus according to a fourth embodiment of the present invention are described below with reference to FIGS. 17 through 19. FIG. 17 is a sectional view showing an exposure apparatus according to the fourth embodiment of the present invention. FIG. 18A is a partially enlarged view showing the exposure apparatus for explaining a calibration function. FIG. 18B is a partially more enlarged view of a part of the exposure apparatus for explaining the calibration function. FIG. 19 is a perspective view showing a mask as viewed from above the mask pattern.

Referring to FIG. 17, the proximity exposure apparatus is constructed as follows. A Y-axis guide 2 is fixed to a frame 1. A Y-stage 4 is installed on the Y-axis guide 2 and is movable in a Y-direction in sliding contact therewith. An X-axis guide 3 is fixed to the Y-stage 4. An X-stage 5 is installed on the X-axis guide 3 and is movable in an X-direction in sliding contact therewith. A locally-illuminating means 6 is fixed to the X-stage 5. A mask face-measuring means 90, of laser reflection type, comprises a light-projecting laser element 9a and a light-receiving element 9b both fixed to the X-stage 5. One end of an optical fiber 8 is connected with the locally-illuminating means 6. A reflection mirror 12 condenses light beams emitted by a mercury lamp 11. A lens 7 is fixed to the inside of the locally-illuminating means 6. A sensor-provided X-stage 25 is installed on the X-axis guide 3 and is movable synchronously with the movement of the X-stage 5 in the X-direction in sliding contact with the X-axis guide 3. A substrate face-measuring means 210, of laser reflection type, comprises a light-projecting laser element 210a and a light-receiving element 210b both fixed to the X-stage 25. An XYθ stage 13 is installed on the frame 1 and is movable in an XY-plane in sliding contact therewith. Three or more piezo-actuators 215 are connected with the XYθ stage 13. A Z-stage 14 is installed on the piezo-actuators 215 and is movable in a Z-direction. A gap-adjusting means 31 comprises the piezo-actuators 215 and the Z-stage 14. A quartz chuck 26 is fixed to the Z-stage 14. A substrate 20 is sucked to and held by the quartz chuck 26. A thin film 22 consists of such as a chrome thin film not transmitting light therethrough and is formed on the substrate 20. One end of a mask frame 16 is fixed to the frame 1 and the other end thereof is connected with the mask chuck 18. A mask 21 is sucked to and held by the mask chuck 18. A mask pattern 23a of chromium etc. is formed on a base material 23b of glass etc. of the mask 21. A light-transmitting gap-measuring window 24 is formed at a portion of the mask pattern 23a. One end of each of two brackets 17 is connected with the mask frame 16 and the other end thereof is installed on an alignment scope 19 and is movable in the X-direction in sliding contact therewith. A control means 37 comprises a gap-setting device 32, a controller 33, and a piezo-driver 34. One end of the control means 37 is electrically connected with the mask face-measuring means 90 and the substrate face-measuring means 210 and the other end thereof is electrically connected with the piezo-actuators 215. In this embodiment, the mask face-measuring means 90 and the substrate face-measuring means 210 constitute the gap-measuring means in cooperation with each other.

The exposure method to be carried out by using the exposure apparatus having the above-described construction is described below.

Light beams emitted by the mercury lamp 11 are condensed by the reflection mirror 12 and then guided to one end of the optical fiber 8. Light fluxes which have left the other end of the optical fiber 8 are adjusted to be parallel with each other by the lens 7 in the locally-illuminating means 6 to irradiate the mask 21. The locally-illuminating means 6 irradiates the surface of the mask 21 held over the substrate 20 proximate to the mask 21 and placed at an appropriate position relative to the substrate 20 by using the alignment scopes 19, while the locally-illuminating means 6 is being moved in the XY-plane above the mask 21 by the X-stage 5, the Y-stage 4, and unshown driving means thereof.

The method of adjusting the gap between the substrate 20 and the mask 21 is described below with reference to FIGS. 17 and 18. First, the X-stage 5 and the Y-stage 4 are moved above the gap-measuring window 24 so that the mask face-measuring means 90 measures the upper face (P) (measured value B) of the thin film 22 formed on the substrate 20, and the substrate face-measuring means 210 measures the lower face Q (measured value C) of the thin film 22. The difference (B–C) is stored by the controller 33 as an offset value (F). That is, the offset value (F) is measured by the gap-measuring means comprising the mask face-measuring means 90 and the substrate face-measuring means 210 and then stored by the controller 33. Then, the X-stage 5 is moved to a portion other than the portion positioned above the gap-measuring window (calibration window) 24, so that the mask face-measuring means 90 measures the lower face (R) (measured value A) of the mask 21. Then, the measured values (A) and (C) are inputted to the controller 33 so as to find the length of the gap between the mask 21 and the substrate 20 by performing calculation of A–C–F. The length of the gap thus found and a value (D) preset in the gap-setting device 32 are compared with each other. Upon receipt of a signal indicating the deviation, the piezo-drive 34 transmits a control signal corresponding to the deviation signal to the piezo-actuators 215 so as to drive the Z-stage 14, thus allowing the substrate 20 and the mask 21 to be moved at positions proximate to each other with a predetermined interval provided therebetween. In this manner, the gap between the mask 21 and the substrate 20 is adjusted at each to-be-scanned position of the mask 21. Thus, the photosensitive layer of the substrate 20 can be exposed to a laser beam at a high resolution.

The gap between the substrate 20 and the mask 21 is measured by utilizing the gap-measuring window 24 provided on the mask side. But it is possible to measure the gap by utilizing the gap-measuring window provided on the substrate side. Further, the gap-measuring means may be provided independently of the mask face-measuring means 90 and the substrate face-measuring means 210.

According to the proximity exposure method and proximity exposure apparatus for carrying out the method, a value measured by the mask face-measuring means and a value measured by the substrate face-measuring means are calibrated in advance by using a value measured by the gap-measuring means. Thus, the gap between the substrate and the mask can be indirectly measured by the mask face-measuring means and the substrate face-measuring means even though a thin film not transmitting a laser beam therethrough is formed on a substrate and/or a mask. Therefore, the gap between the substrate and the mask can be adjusted accurately at each scanned position. Thus, an image having a high resolution can be formed on the entire exposed region by transfer.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An exposure apparatus for irradiating a mask from above the mask held in proximity to a substrate to transfer a mask pattern of the mask to the substrate by exposing the substrate to a light beam, comprising:

a locally-irradiating means, for scanning the mask from above the mask, having a mask-deforming means for flexing the mask locally by a static pressure so as to cause the mask and the substrate to each other;

a gap-measuring means for measuring a gap between the mask and the substrate at a portion of the mask irradiated by the locally-irradiating means and at a portion of the substrate irradiated thereby; and a control means for controlling the mask-deforming means, based on a value measured by the gap-measuring means and a preset value.

2. The exposure apparatus as claimed in claim 1, wherein an air jetting means for jetting air to the mask to move the mask upward by a negative pressure is provided in a periphery of the mask-deforming means.

3. The exposure apparatus as claimed in claim 1, wherein a suction means for drawing the mask upward by a negative pressure is provided in a periphery of the mask-deforming means.

4. An exposure apparatus for irradiating a mask from above the mask held in proximity to a substrate to transfer a mask pattern of the mask to the substrate by exposing the substrate to a light beam, comprising:

a locally-irradiating means for scanning the mask from above the mask;

a gap-measuring means for measuring a gap between the mask and the substrate at a portion of the mask irradiated by the locally-irradiating means and at a portion of the substrate irradiated thereby;

a chuck comprising a slight-moving means for drawing and holding the substrate and vertically moving a portion, of the mask, to be irradiated by the locally-irradiating means so as to cause the substrate and the mask to approach each other locally; and a control means for controlling the slight-moving means based on a value measured by the gap-measuring means and a preset value.

5. The exposure apparatus as claim in claim 1, further comprising:

a gap-adjusting means for adjusting the gap between the substrate and the mask, a mask face-measuring means, positioned on a mask side, for scanning the mask synchronously with a movement of the locally-irradiating means so as to detect a height of a mask face of the mask in a portion thereof irradiated by the locally-irradiating means; and a substrate face-measuring means, positioned on a substrate side, for scanning the substrate synchronously with a movement of the locally-irradiating means so as to detect a height of a substrate face of the substrate in a portion thereof irradiated by the locally-irradiating means, and wherein the control means determines the gap between the substrate and the mask indirectly by calibrating a difference between the value measured by the mask face-measuring means and the value measured by the substrate face-measuring means and based on the value measured by the mask face-measuring means and the value measured by the substrate face-measuring means, thus controlling the gap-adjusting means based on a value of the gap found determined indirectly and the preset value.

6. The exposure apparatus as claimed in claim 5, wherein the mask face-measuring means and the substrate face-measuring means cooperate with each other so as to constitute the gap-adjusting means.

7. The exposure apparatus as claimed in claim 6, wherein each of the mask face-measuring means and the substrate face-measuring means is composed of a laser reflection type measuring device.

8. The exposure apparatus as claim in claim 4, further comprising:

a gap-adjusting means for adjusting the gap between the substrate and the mask, a mask face-measuring means, positioned on a mask side, for scanning the mask synchronously with a movement of the locally-irradiating means so as to detect a height of a mask face of the mask in a portion thereof irradiated by the locally-irradiating means; and a substrate face-measuring means, positioned on a substrate side, for scanning the substrate synchronously with a movement of the locally-irradiating means so as to detect a height of a substrate face of the substrate in a portion thereof irradiated by the locally-irradiating means, and wherein the control means determines the gap between the substrate and the mask indirectly by calibrating a difference between the value measured by the mask face-measuring means and the value measured by the substrate face-measuring means and based on the value measured by the mask face-measuring means and the value measured by the substrate face-measuring means, thus controlling the gap-adjusting means based on a value of the gap determined indirectly and the preset value.

9. The exposure apparatus as claimed in claim 8, wherein the mask face-measuring means and the substrate face-measuring means cooperate with each other so as to constitute the gap-adjusting means.

10. The exposure apparatus as claimed in claim 9, wherein each of the mask face-measuring means and the substrate face-measuring means is composed of a laser reflection type measuring device.

* * * * *